(12) United States Patent
Vidyarthi et al.

(10) Patent No.: US 10,727,058 B2
(45) Date of Patent: Jul. 28, 2020

(54) METHODS FOR FORMING AND ETCHING STRUCTURES FOR PATTERNING PROCESSES

(71) Applicant: Applied Materials, Inc., Santa Clara, CA (US)

(72) Inventors: Vinay Shankar Vidyarthi, San Jose, CA (US); Rajinder Dhindsa, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/521,306

(22) Filed: Jul. 24, 2019

(65) Prior Publication Data

US 2020/0058503 A1   Feb. 20, 2020

Related U.S. Application Data

(60) Provisional application No. 62/719,999, filed on Aug. 20, 2018.

(51) Int. Cl.
| | | |
|---|---|---|
| *H01L 21/00* | (2006.01) | |
| *H01L 21/033* | (2006.01) | |
| *H01L 21/02* | (2006.01) | |
| *H01L 21/311* | (2006.01) | |

(52) U.S. Cl.
CPC .... *H01L 21/0337* (2013.01); *H01L 21/02118* (2013.01); *H01L 21/31116* (2013.01); *H01L 21/31138* (2013.01)

(58) Field of Classification Search
CPC .......... H01L 21/0337; H01L 21/02118; H01L 21/31116; H01L 21/31138
See application file for complete search history.

(56) References Cited

U.S. PATENT DOCUMENTS

| | | | |
|---|---|---|---|
| 5,328,810 A * | 7/1994 | Lowrey | H01L 21/0271 148/DIG. 106 |
| 7,935,639 B2 | 5/2011 | Li | |
| 8,338,304 B2 | 12/2012 | Zhou | |
| 9,177,820 B2 | 11/2015 | Bergendahl et al. | |
| 9,978,596 B2 | 5/2018 | Zhang et al. | |
| 2007/0077524 A1 | 4/2007 | Koh et al. | |
| 2010/0258913 A1 | 10/2010 | Lue | |
| 2014/0170853 A1 | 6/2014 | Shamma et al. | |
| 2015/0151329 A1 | 6/2015 | Kawanishi et al. | |
| 2015/0155176 A1 | 6/2015 | Mignot et al. | |
| 2019/0189444 A1* | 6/2019 | Sun | H01L 21/32139 |
| 2019/0196336 A1* | 6/2019 | Tiron | H01L 21/02118 |

* cited by examiner

*Primary Examiner* — Nikolay K Yushin
(74) *Attorney, Agent, or Firm* — Patterson + Sheridan, LLP

(57) ABSTRACT

Embodiments of the present disclosure provide methods and apparatus for forming and patterning a spacer layer for multi-patterning processes. In one embodiment, a method for patterning a spacer layer on a substrate includes forming a protective layer on a spacer layer disposed on a structure disposed on a substrate, wherein the protective layer is formed predominately on a top surface of the spacer layer, than a bottom surface of the spacer layer, etching the spacer layer from the bottom surface, forming a polymer layer on the substrate, etching a top portion of the polymer layer and a first portion the spacer layer located the top surface of the structure, and removing the structure from the substrate and leaving a second portion the spacer layer on the substrate.

20 Claims, 5 Drawing Sheets

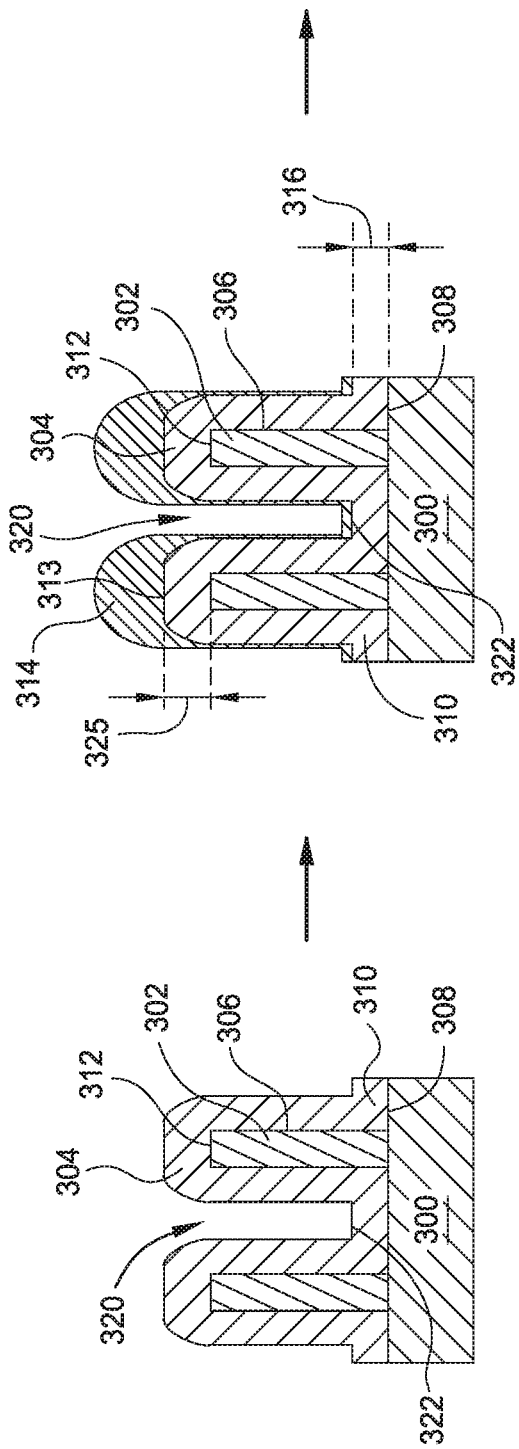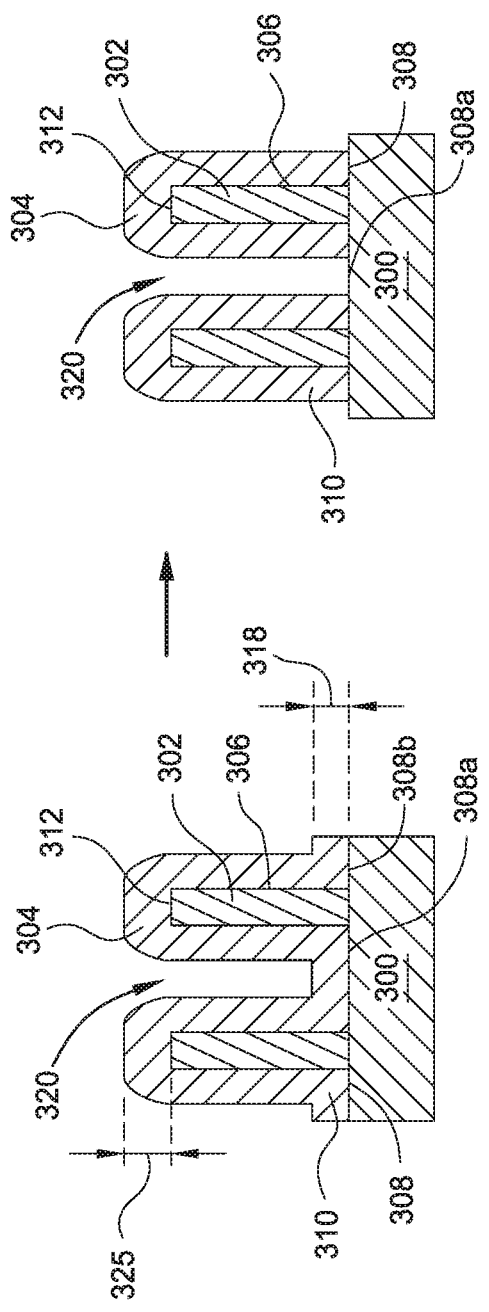
FIG. 3A
FIG. 3B
FIG. 3C
FIG. 3D

METHODS FOR FORMING AND ETCHING STRUCTURES FOR PATTERNING PROCESSES

CROSS-REFERENCE TO RELATED APPLICATIONS

This application claims benefit of U.S. Provisional Application Ser. No. 62/719,999 filed Aug. 20, 2018, which incorporated by reference in its entirety.

BACKGROUND

Field

Examples of the present disclosure generally relate to deposition and etching processes for multi-patterning process. Particularly, embodiments of the present disclosure provide methods for deposition and etching processes for multi-patterning process in semiconductor applications.

Description of the Related Art

In the manufacture of integrated circuits (IC), or chips, patterns representing different layers of the chip are created by a chip designer. A series of reusable masks, or photomasks, are created from these patterns in order to transfer the design of each chip layer onto a semiconductor substrate during the manufacturing process. Mask pattern generation systems use precision lasers or electron beams to image the design of each layer of the chip onto a respective mask. The masks are then used much like photographic negatives to transfer the circuit patterns for each layer onto a semiconductor substrate. These layers are built up using a sequence of processes and translate into the tiny transistors and electrical circuits that comprise each completed chip. Thus, any defects in the mask may be transferred to the chip, potentially adversely affecting performance. Defects that are severe enough may render the mask completely useless. Typically, a set of 15 to 100 masks is used to construct a chip and can be used repeatedly.

With the shrinking of critical dimensions (CD), present optical lithography is approaching a technological limit at the 45 nanometer (nm) technology node. Next generation lithography (NGL) is expected to replace the conventional optical lithography method, for example, in the 20 nm technology node and beyond. The images of the patterned mask are projected through the high-precision optical system onto the substrate surface, which is coated with a layer of photoresist. The patterns are then formed on the substrate surface after complex chemical reactions and follow-on manufacturing steps, such as development, post-exposure bake and wet or dry etching.

Multiple patterning technique is a technology developed for photolithography to enhance the feature density and accuracy. This technique is commonly used for patterns in the same layer which look different or have incompatible densities or pitches. Furthermore, between each patterning process, additional layers or structures may be formed, added or replenished in order to enable the next patterning process. However, as the dimension requirement keeps pushing to the limit, deformed profiles, height loss or other defects resulted from the patterning processes have significantly impacted the critical dimension (CD) control and feature transfer to the target materials in the device structures. As a result, undesired structure profiles and inaccurate resultant dimensions render early failure of the device performance.

Therefore, there is a need for an apparatus for performing a patterning process with a desired material or deposition replenishing mechanism during the patterning process.

SUMMARY

Embodiments of the present disclosure provide methods and apparatus for forming and patterning a spacer layer for multi-patterning processes. In one embodiment, a method for patterning a spacer layer on a substrate includes forming a protective layer on a spacer layer disposed on a structure disposed on a substrate, wherein the protective layer is formed predominately on a top surface of the spacer layer, than a bottom surface of the spacer layer, etching the spacer layer from the bottom surface, forming a polymer layer on the substrate, etching a top portion of the polymer layer and a first portion the spacer layer located the top surface of the structure, and removing the structure from the substrate and leaving a second portion the spacer layer on the substrate.

In another embodiment, a method for patterning a spacer layer on a substrate includes repeatedly forming a protective layer and etching a bottom portion of a spacer layer formed on a structure on a substrate until the bottom portion of the spacer layer is etched away and a surface of the substrate is exposed, wherein the spacer layer is conformally formed on the structure having a top portion, sidewall portions, and the bottom portion, forming a polymer layer predominately on the top portion of the spacer layer, etching the polymer layer and the top portion of the spacer layer and leaving the sidewall portions of the spacer layer lining on the structure, and removing the structure from the substrate.

In yet another embodiment, a method for patterning a spacer layer on a substrate includes selectively etching a bottom portion of a spacer layer disposed on a substrate while having a protective layer formed on a top portion of the spacer layer, etching the bottom portion of the spacer layer until the substrate disposed thereunder is exposed, forming a polymer layer on the top portion of the spacer layer and etching the polymer layer and the spacer layer to form openings in the spacer layer.

BRIEF DESCRIPTION OF THE DRAWINGS

So that the manner in which the above recited features of the present disclosure are attained and can be understood in detail, a more particular description of the disclosure, briefly summarized above, may be had by reference to the embodiments thereof which are illustrated in the appended drawings.

FIGS. 3A-3H illustrate cross sectional views of a substrate during the deposition process of FIG. 2.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

Methods for patterning features and manufacturing nanostructures with desired small dimensions in a film stack are provided. The methods utilize a protective layer and/or a polymer layer deposition process to form a protective layer and/or a polymer layer to protect certain regions of the structures on the substrate while patterning a spacer layer in the structure as needed. By doing so, different regions of the spacer layer maybe patterned or etched at different rates or different orders so that the structure on the substrate may be pertained at a desired profile after the patterning process. In one example, several types of the protective layers and/or polymer layers may be formed at different locations of the spacer layer as well as of the structures on the substrate to facilitate the patterning process.

The term "substrate" as used herein refers to a layer of material that serves as a basis for subsequent processing operations and includes a surface to be cleaned. For example, the substrate can include one or more material containing silicon containing materials, group IV or group III-V containing compounds, such as Si, polysilicon, amorphous silicon, silicon nitride, silicon oxynitride, silicon oxide, Ge, SiGe, GaAs, InP, InAs, GaAs, GaP, InGaAs, InGaAsP, GaSb, InSb and the like, or combinations thereof. Furthermore, the substrate can also include dielectric materials such as silicon dioxide, organosilicates, and carbon doped silicon oxides. The substrate may also include one or more conductive metals, such as nickel, titanium, platinum, molybdenum, rhenium, osmium, chromium, iron, aluminum, copper, tungsten, or combinations thereof. Further, the substrate can include any other materials such as metal nitrides, metal oxides and metal alloys, depending on the application. In one or more embodiments, the substrate can form a contact structure, a metal silicide layer, or a gate structure including a gate dielectric layer and a gate electrode layer to facilitate connecting with an interconnect feature, such as a plug, via, contact, line, and wire, subsequently formed thereon, or suitable structures utilized in semiconductor devices.

Moreover, the substrate is not limited to any particular size or shape. The substrate can be a round wafer having a 200 mm diameter, a 300 mm diameter, a 450 mm diameter or other diameters. The substrate can also be any polygonal, square, rectangular, curved or otherwise non-circular workpiece, such as a polygonal glass, plastic substrate used in the fabrication of flat panel displays.

Figure 1:
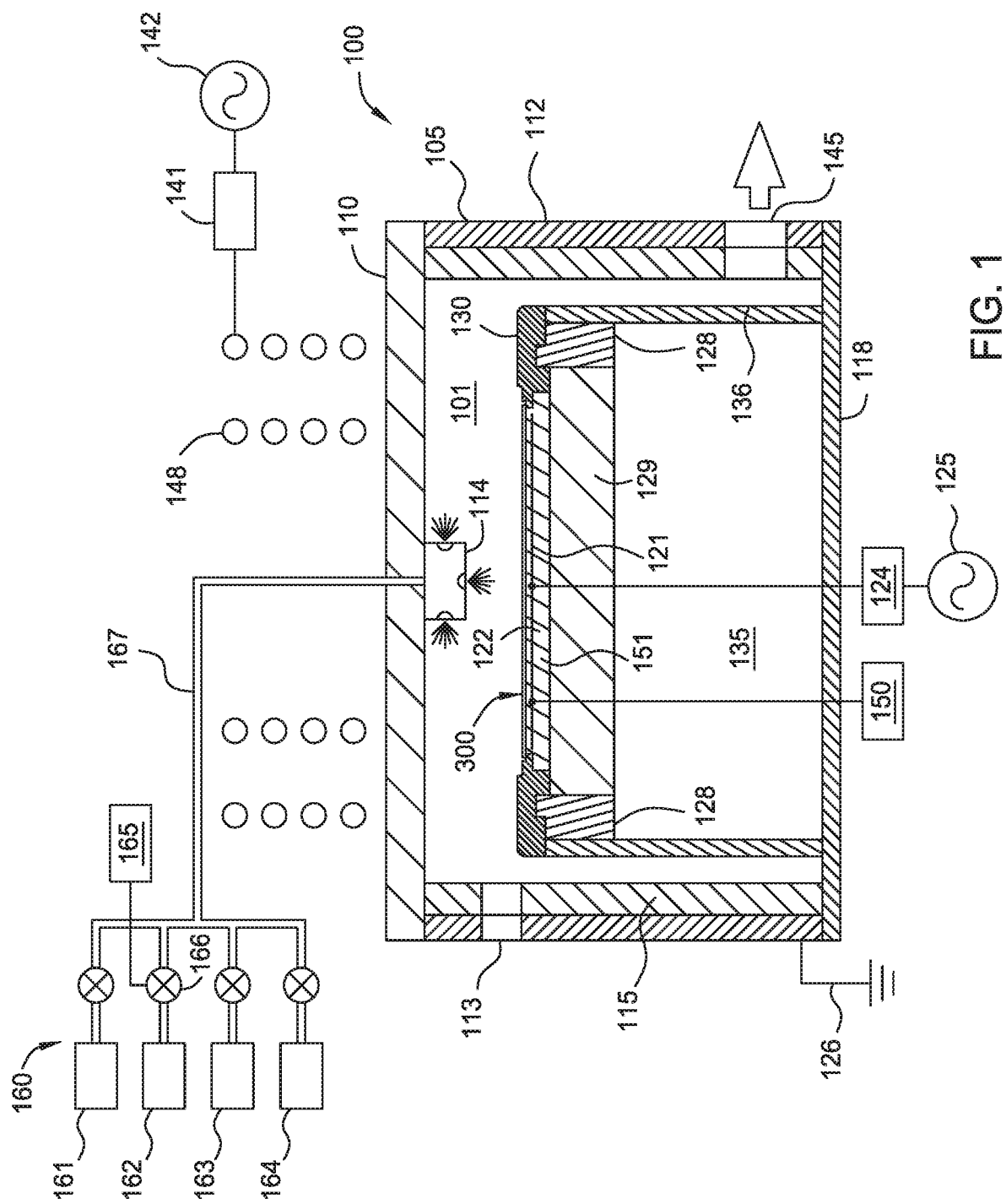
FIG. 1 is a schematic cross-sectional view of a processing chamber configured to perform a patterning process according to one or more embodiments of the disclosure.

FIG. 1 is a simplified cutaway view for an exemplary processing chamber 100 suitable for patterning a material layer disposed on a substrate 300 in the processing chamber 100. The exemplary processing chamber 100 is suitable for performing a patterning process. One example of the processing chamber 100 that may be adapted to benefit from the disclosure is an CENTRIS® Sym3™ etching processing chamber, available from Applied Materials, Inc., located in Santa Clara, Calif. It is contemplated that other process chambers, including those from other manufactures, may be adapted to practice embodiments of the disclosure.

The plasma processing chamber 100 includes a chamber body 105 having a chamber volume 101 defined therein. The chamber body 105 has sidewalls 112 and a bottom 118 which are coupled to ground 126. The sidewalls 112 have a liner 115 to protect the sidewalls 112 and extend the time between maintenance cycles of the plasma processing chamber 100. The dimensions of the chamber body 105 and related components of the plasma processing chamber 100 are not limited and generally are proportionally larger than the size of the substrate 300 to be processed therein. Examples of substrate sizes include 200 mm diameter, 250 mm diameter, 300 mm diameter and 450 mm diameter, among others.

The chamber body 105 supports a chamber lid assembly 110 to enclose the chamber volume 101. The chamber body 105 may be fabricated from aluminum or other suitable materials. A substrate access port 113 is formed through the sidewall 112 of the chamber body 105, facilitating the transfer of the substrate 300 into and out of the plasma processing chamber 100. The access port 113 may be coupled to a transfer chamber and/or other chambers of a substrate processing system (not shown).

A pumping port 145 is formed through the sidewall 112 of the chamber body 105 and connected to the chamber volume 101. A pumping device (not shown) is coupled through the pumping port 145 to the chamber volume 101 to evacuate and control the pressure therein. The pumping device may include one or more pumps and throttle valves.

A gas panel 160 is coupled by a gas line 167 to the chamber body 105 to supply process gases into the chamber volume 101. The gas panel 160 may include one or more process gas sources 161, 162, 163, 164 and may additionally include inert gases, non-reactive gases, and reactive gases, if desired. Examples of process gases that may be provided by the gas panel 160 include, but are not limited to, hydrocarbon containing gas including methane ($CH_4$), sulfur hexafluoride ($SF_6$), silicon chloride ($SiCl_4$), carbon tetrafluoride (CEO, hydrogen bromide (HBr), hydrocarbon containing gas, argon gas (Ar), chlorine ($Cl_2$), nitrogen ($N_2$), helium (He) and oxygen gas ($O_2$). Additionally, process gasses may include nitrogen, chlorine, fluorine, oxygen and hydrogen containing gases such as $BCl_3$, $C_2F_4$, $C_4F_5$, $C_4F_6$, $CHF_3$, $CH_2F_2$, $CH_3F$, $NF_3$, $NH_3$, $CO_2$, $SO_2$, $CO$, $N_2$, $NO_2$, $N_2O$ and $H_2$ among others.

Valves 166 control the flow of the process gases from the sources 161, 162, 163, 164 from the gas panel 160 and are managed by a controller 165. The flow of the gases supplied to the chamber body 105 from the gas panel 160 may include combinations of the gases.

The lid assembly 110 may include a nozzle 114. The nozzle 114 has one or more ports for introducing the process gases from the sources 161, 162, 164, 163 of the gas panel 160 into the chamber volume 101. After the process gases are introduced into the plasma processing chamber 100, the gases are energized to form plasma. An antenna 148, such as one or more inductor coils, may be provided adjacent to the plasma processing chamber 100. An antenna power supply 142 may power the antenna 148 through a match circuit 141 to inductively couple energy, such as RF energy, to the process gas to maintain a plasma formed from the process gas in the chamber volume 101 of the plasma processing chamber 100. Alternatively, or in addition to the antenna power supply 142, process electrodes below the substrate 300 and/or above the substrate 300 may be used to capacitively couple RF power to the process gases to maintain the plasma within the chamber volume 101. The operation of the power supply 142 may be controlled by a controller, such as controller 165, that also controls the operation of other components in the plasma processing chamber 100.

A substrate support pedestal 135 is disposed in the chamber volume 101 to support the substrate 300 during processing. The substrate support pedestal 135 may include an electrostatic chuck 122 for holding the substrate 300 during processing. The electrostatic chuck (ESC) 122 uses the electrostatic attraction to hold the substrate 300 to the substrate support pedestal 135. The ESC 122 is powered by an RF power supply 125 integrated with a match circuit 124. The ESC 122 comprises an electrode 121 embedded within a dielectric body. The electrode 121 is coupled to the RF power supply 125 and provides a bias which attracts plasma ions, formed by the process gases in the chamber volume 101, to the ESC 122 and substrate 300 positioned thereon. The RF power supply 125 may cycle on and off, or pulse, during processing of the substrate 300. The ESC 122 has an isolator 128 for the purpose of making the sidewall of the ESC 122 less attractive to the plasma to prolong the maintenance life cycle of the ESC 122. Additionally, the substrate support pedestal 135 may have a cathode liner 136 to protect the sidewalls of the substrate support pedestal 135 from the plasma gases and to extend the time between maintenance of the plasma processing chamber 100.

Furthermore, the electrode 121 is coupled to a power source 150. The power source 150 provides a chucking voltage of about 200 volts to about 2000 volts to the electrode 121. The power source 150 may also include a system controller for controlling the operation of the electrode 121 by directing a DC current to the electrode 121 for chucking and de-chucking the substrate 300.

The ESC 122 may include heaters disposed therein and connected to a power source (not shown), for heating the substrate, while a cooling base 129 supporting the ESC 122 may include conduits for circulating a heat transfer fluid to maintain a temperature of the ESC 122 and substrate 300 disposed thereon. The ESC 122 is configured to perform in the temperature range required by the thermal budget of the device being fabricated on the substrate 300. For example, the ESC 122 may be configured to maintain the substrate 300 at a temperature of about minus about 25 degrees Celsius to about 500 degrees Celsius for certain embodiments.

The cooling base 129 is provided to assist in controlling the temperature of the substrate 300. To mitigate process drift and time, the temperature of the substrate 300 may be maintained substantially constant by the cooling base 129 throughout the time the substrate 300 is in the cleaning chamber. In one embodiment, the temperature of the substrate 300 is maintained throughout subsequent cleaning processes at about 30 to 120 degrees Celsius.

A cover ring 130 is disposed on the ESC 122 and along the periphery of the substrate support pedestal 135. The cover ring 130 is configured to confine etching gases to a desired portion of the exposed top surface of the substrate 300, while shielding the top surface of the substrate support pedestal 135 from the plasma environment inside the plasma processing chamber 100. Lift pins (not shown) are selectively moved through the substrate support pedestal 135 to lift the substrate 300 above the substrate support pedestal 135 to facilitate access to the substrate 300 by a transfer robot (not shown) or other suitable transfer mechanism.

The controller 165 may be utilized to control the process sequence, regulating the gas flows from the gas panel 160 into the plasma processing chamber 100 and other process parameters. Software routines, when executed by the CPU, transform the CPU into a specific purpose computer (controller) that controls the plasma processing chamber 100 such that the processes are performed in accordance with the present disclosure. The software routines may also be stored and/or executed by a second controller (not shown) that is collocated with the plasma processing chamber 100.

Figure 2:
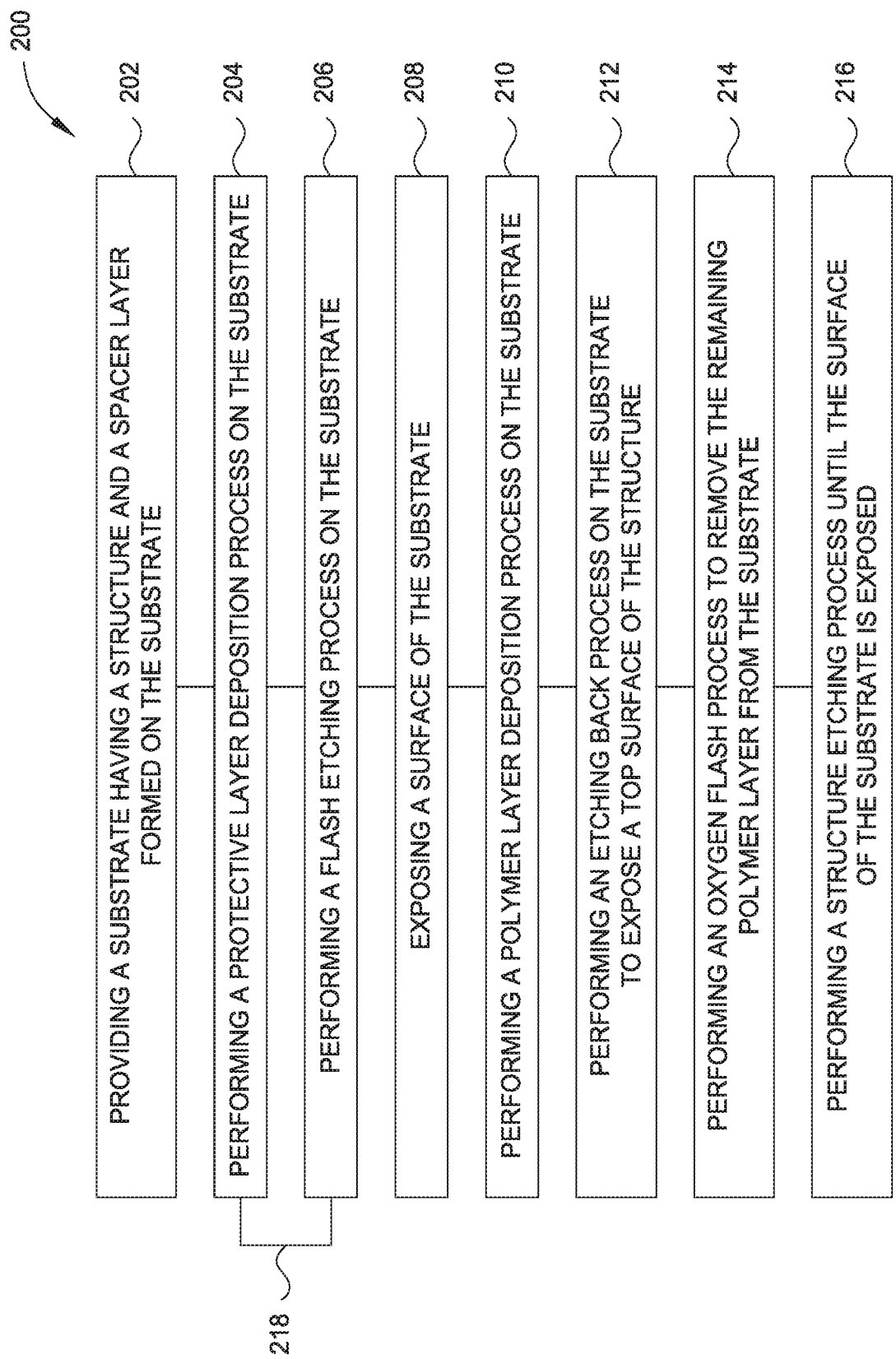
FIG. 2 is a flowchart of a method for patterning a material layer on a substrate, according to one or more embodiments of the present disclosure.
Figure 3F:
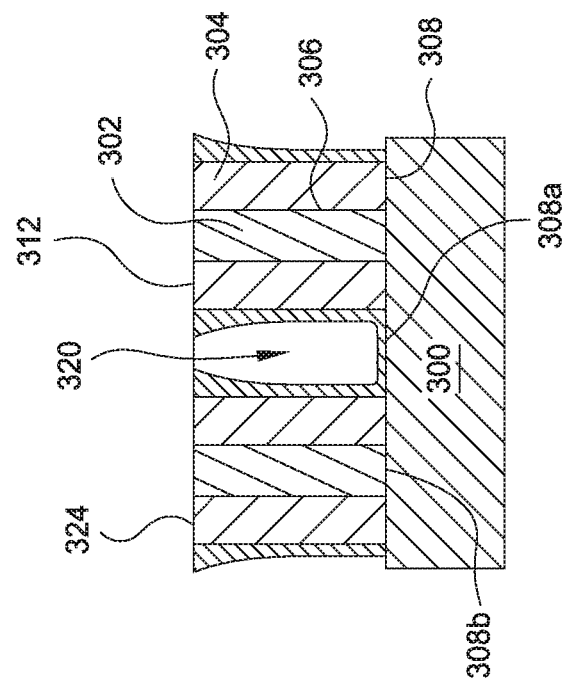

FIG. 2 is a flow diagram of one example of a method 200 for a deposition and patterning process for patterning a material layer (or called a spacer layer) on a structure disposed on a substrate. The spacer layer may be later utilized to serve as a mask layer or a passivation layer to further alter dimensions or profiles of the features on the substrate for further feature transfer to the underlying layers disposed under the material layer. FIGS. 3A-3H are cross-sectional views of a portion of a substrate 300 with a structure 302 formed thereon corresponding to various stages of the method 200. The method 200 may be utilized to deposit polymer layers onto a spacer layer 304 formed on the structures 302 with different material requirements so as to form multiple sacrificial mask layers at different stages of the patterning process, as shown in FIG. 3A. Thus, the polymer layers may be utilized as sacrificial (e.g., tentative) etching masks to form features into the spacer layer 304 so as to transfer features into the structures 302 formed on the substrate 300.

The method 200 begins at operation 202 by providing the substrate 300 having the structure 302 formed thereon. The substrate 300, as shown in FIG. 3A, is placed in a processing chamber, such as the processing chamber 100 depicted in FIG. 1 to perform a deposition process prior to a patterning process. In one example, the processing chamber 100 is an etching chamber or a patterning chamber that allows the substrate 300 to be disposed therein to perform a deposition process to facilitate the patterning process performed thereafter. The structure 302 includes patterned features formed in a desired distance away from each other with openings 320 formed therebetween. In one embodiment, the structure 302 may be fabricated from a dielectric layer or a photoresist layer utilized to form a layer in a semiconductor device. Suitable examples of the dielectric layer include carbon-containing layer, such as silicon oxides (SiOC), polymer materials, amorphous carbon, or the like.

The spacer layer 304 is conformally formed on the outer surface of the structure 302, such as on the top surface 312 and sidewall 306 of the structure 302 as well as on the surface 308 of the substrate 300. Suitable materials for the spacer layer 304 may include a dielectric layer, such as a silicon containing layer, different from the material utilized to form the structure 302. Thus, in one example, the spacer layer 304 and the structure 302 are fabricated from different materials. Suitable examples of the silicon containing layer include carbon-containing silicon oxides (SiOC), SOG, USG, silicon oxide, silicon nitride, silicon oxynitride, silicon carbide, silicon oxycarbide, silicon boride, or the like. Alternatively, the method 200 may be beneficially utilized to form materials on suitable types of structures as needed.

In the example wherein the structure 302 includes a photoresist layer, the photoresist layer may be utilized for extreme ultraviolet (EUV) applications as needed. The patterned photoresist layer may be an organic resist layer. In the example wherein the structure 302 includes a dielectric layer, the dielectric layer may be a silicon oxide, silicon nitride, silicon oxynitride (SiON), silicon oxycarbide (SiOC), or amorphous carbon materials as needed. In a specific example, the structure 302 is fabricated from amorphous carbon and the spacer layer is fabricated from silicon oxide.

At operation 204, a protective layer deposition process is performed to form a protective layer 314 on the spacer layer 304, as shown in FIG. 3B. The spacer layer 304 may have a first thickness 325 formed on the top surface 312 of the structure 302 and a second thickness 316 formed on the surface 308 of the substrate 300. The first and the second thicknesses 325, 316 are substantially similar as the spacer layer 304 is conformally formed on the substrate 300.

The protective layer deposition process at operation 204 is performed by supplying a first deposition gas mixture into the processing chamber 100 into the surface of the substrate 300 to form the protective layer 314 with a desired thickness on the spacer layer 304. The protective layer 314 is formed predominately on the top surface 313 of the spacer layer 304. In one example, the first deposition gas mixture includes a first gas precursor that comprises a hydrocarbon containing gas and a halogen containing gas. It is believed that the carbon elements from the hydrocarbon containing gas may assist forming the protective layer 314 (e.g., a polymer material) on the structure 302 while the halogen elements from the halogen containing gas may sharpen the profile of the protective layer 314 formed on the structure 302. For example, by proper control of the process parameters during the protection layer deposition process at operation 204, the protective layer 314 may predominately be formed on the top surface 313 of the spacer layer 304 with relatively lower deposition on the bottom surface 322 of the spacer layer 304. The carbon elements from the hydrocarbon containing layer may be controlled to fall on the top surface 313 of the spacer layer 304. In the meanwhile, the halogen containing gas may be controlled to etch a portion of the protective layer 314, predominately located in the opening 320 between the structures 302. By doing so, a relatively thinner protective layer 314 is formed on the bottom surface 322 of the spacer layer 304, as compared to the protective layer 314 located above the top surface 313 of the spacer layer 304. The thinner protective layer 314 may facilitate the patterning process performed subsequently to etch the spacer layer 304 from the bottom surface 322 faster than etching from the top surface 313.

Suitable examples of the hydrocarbon containing gas generally have a formula $C_xH_y$, wherein x and y are integers from 1 to 20. Suitable examples of the hydrocarbon containing gas include $CH_4$, $C_2H_4$, $C_2H_6$, $C_3H_8$, $C_3H_6$, $C_4H_8$, $C_4H_{10}$ and the like. Suitable examples of the halogen containing gas include $C_4F_6$, $CF_4$, $C_2F_4$, $C_2F_6$, $C_3F_8$, $C_3F_6$, $CHF_3$, $SiCl_4$ and the like. In one specific example, the first deposition gas mixture includes $CH_4$ and $C_4F_6$.

Suitable examples of the halogen containing gas include fluorine containing gases, such as $C_4F_6$, $CF_4$, $C_2F_6$, and the like. Inert gas, such as He or Ar, can also be added to the first deposition gas mixture as needed.

In one example, the protective layer 314 is a hydrocarbon containing material.

During deposition, several process parameters may also be regulated. In one exemplary embodiment, a process pressure in the processing chamber 100 is regulated between about 10 mTorr and about 5000 mTorr, such as between about 10 mTorr and about 200 mTorr. A RF source and/or bias power may be utilized while forming the protective layer 314. The RF source and the RF bias power may be applied to the processing chamber in continuous mode or in pulsed mode. In one example, the RF bias power is not applied while supplying the first deposition gas mixture. The elimination of the RF bias power while performing the deposition process can assist the reactive species in the plasma generated from the first deposition gas mixture to be more uniformly distributed across the substrate surface, close to the top surface of the 313 of the spacer layer 304. In one example, the RF source power at a frequency of about 13 MHz may be applied to maintain a plasma in the deposition gas mixture. For example, a RF source power of about 20 Watts to about 200 Watts may be applied to maintain a plasma inside the processing chamber 100. Thus, the protective layer 314 as formed can be predominately formed on the top surface 313 of the spacer layer 304, rather than on the bottom surface 322 of the spacer layer 304 in the opening 320. As a result, the protective layer 314 formed on the top surface 313 of the spacer layer 304 has a thickness greater than the thickness formed on the bottom surface 322 of the spacer layer 304. In one example, the thickness on the top surface 313 of the spacer layer 304 may be about 5% to about 70%, such as about 7% to about 50% or about 10% to about 40%, greater than the thickness on the bottom surface 322 of the spacer layer 304.

The first deposition gas mixture may be flowed into the chamber at a rate between about 5 sccm to about 800 sccm. The hydrocarbon containing gas and the halogen containing gas from the first deposition gas mixture may be supplied simultaneously to the processing chamber or alternatively or sequentially supplied as needed. In one example, the hydrocarbon containing gas is first supplied in the first deposition gas mixture followed by the halogen containing gas. After a desired amount of the protective layer 314 is formed on the spacer layer 304, then the halogen containing gas may then supplied to remove some redundant protective layer 314 located primarily in the opening 320 so that the etchants from the following etching process may have an easier access to etching the spacer layer 304 located in the opening 320 from the bottom surface 322.

A substrate temperature is maintained between about 10 degrees Celsius to about 300 degrees Celsius, such as between about 20 degrees Celsius and about 80 degrees Celsius, for example between about 30 degrees Celsius and about 50 degrees Celsius.

At operation 206, a flash etching process is performed to etch away the redundant protective layer 314 located primarily in the opening 320 as well as the spacer layer 304 located in the opening 320 from the bottom surface 322. The flash etching process allows the spacer layer 304 to be incrementally etched from the bottom surface 322 while pertaining sufficient protection on the top surface 313. Thus, the bottom surface 322 of the spacer layer 304 may be predominately etched in the flash etching process at operation 206 without substantially damaging the top surface 313 of the spacer layer 304 by the sufficient protection of the protective layer 314.

For example, after the flash etching process, the first thickness 325 of the spacer layer 304 located on top surface 312 of the structure 302 may be maintained substantially the same while a third thickness 318 of the spacer layer 304 formed on the surface 308a, 308b of the substrate 300 exposed by the opening 320 (e.g., surface 308a, 308b of the substrate 300 under the opening 320) may be reduced, as compared to the second thickness 316, as shown in FIG. 3B, prior to the flash etching process.

It is noted that the operation 204 and operation 206 may be repeatedly performed as many times as needed, as indicated by the loop 218. By cycles and repeated deposition and etching processes at operation 204 and 206, the regions (e.g., the bottom surface 322) of the spacer layer 304 exposed by the opening 320 may be incrementally or gradually etched while with sufficient protection on the top surface 313 of the spacer layer 304. The protective layer 314 may also be timely replenished at each cycle of the deposition process so that one location (e.g., the regions exposed by the opening 320) of the spacer layer 304 may be continuously etched while another region (e.g., the regions on the top surface 312 of the structure 302) may be eliminated from etching by the protection of the protective layer 314.

In one example, the flash etching process is performed by supplying a first etching gas mixture followed by an oxygen flash gas mixture. The first gas mixture includes an inert gas and/or a fluorine containing gas. The oxygen flash gas mixture includes an oxygen containing gas. It is believed that the first etching gas mixture can activate the elements on the surface of the substrate 300 and efficiently etch the protective layer 314. Thus, after the oxygen flash gas mixture supplied thereafter, the oxygen elements from the oxygen containing gas can then efficiently remove with the residuals built up during the first etching gas mixture reaction, forming volatile species ready to be pumped out from the processing chamber 100.

Thus, after the flash etching process, the opening 320 may be cleared, ready for the next cycle of the deposition and etching processes at operation 204 and 206. In one embodiment, the first etching gas mixture include an inert gas, such as He or Ar, and/or a fluorine containing layer. Suitable examples of the fluorine containing gas include $NF_3$, HF, $CF_4$, $CHF_3$, and the like. Suitable examples of the oxygen containing gas include $O_2$, $NO_2$, $N_2O$, $O_3$, $H_2O$ and the like. In one particular example, the fluorine containing gas supplied in the first gas mixture is $NF_3$ and the oxygen containing gas is $O_2$.

During the etching process, several process parameters may also be regulated. In one exemplary embodiment, a process pressure in the processing chamber 100 is regulated between about 10 mTorr and about 5000 mTorr, such as between about 10 mTorr and about 200 mTorr. A RF source and/or bias power may be utilized while performing the flash etching process. The RF source and the RF bias power may be applied to the processing chamber in continuous mode or in pulsed mode. In one example, the RF bias power is applied while supplying the first etching gas mixture but not applied while supplying the oxygen containing gas.

The RF bias power applied when supplying the first etching gas mixture assists forming the reactive etchants with desired directionality so as to travel down to the bottom surface 322 of the spacer layer 304 to predominately etching the spacer layer 304 exposed by the opening 320. In contrast, the elimination of the RF bias power while supplying the oxygen containing gas can assist the reactive species in the plasma to be more uniformly distributed across the substrate surface, close to the top surface of the 313 of the spacer layer 304 so as to remove the etching residuals from the substrate surface. In one example, the RF source power at a frequency of about 13 MHz may be applied to maintain a plasma in the deposition gas mixture. For example, a RF source power of about 20 Watts to about 1000 Watts may be applied to maintain a plasma inside the processing chamber 100. A RF bias power of about 100 Watts and about 300 Watts may be applied while supplying the first etching gas mixture, but not the during the supply of the oxygen containing gas.

The first etching gas mixture and the oxygen containing gas may be flowed into the chamber at a rate between about 5 sccm to about 900 sccm. The first etching gas mixture, such as the inert gas and/or the fluorine containing gas, and the oxygen containing gas may be supplied simultaneously to the processing chamber or alternatively or sequentially supplied as needed. In one example, the inert gas and/or the fluorine containing gas is first supplied followed by the oxygen containing gas. After a desired amount of the spacer layer 304 is removed, particularly in the region exposed by the opening 320, then the oxygen containing gas may then supplied.

A substrate temperature is maintained between about 10 degrees Celsius to about 300 degrees Celsius, such as between about 20 degrees Celsius and about 80 degrees Celsius, for example between about 30 degrees Celsius and about 50 degrees Celsius.

It is noted that after each cycle of the operation 204 and 206, about 10 percent of the spacer layer 304 in the region exposed by the opening 320 is exposed. It is noted that the operation 204 and 206 may be repeatedly performed as many times as needed to achieve the desired etching profiles.

At operation 208, after about 20 to 40 times of the cycles of the operation 204 and 206, the surface 308a, particularly the surface 308a of the substrate 300 exposed by the opening 320 under the spacer layer 304, is exposed, as shown in FIG. 3D. In the meanwhile, some regions of the spacer layer 304 is still maintained and conformally circumscribed the structure 302 formed on the substrate 300, such as lining on the sidewall 306 and top surface 312 of the structure 302.

Figure 3E:
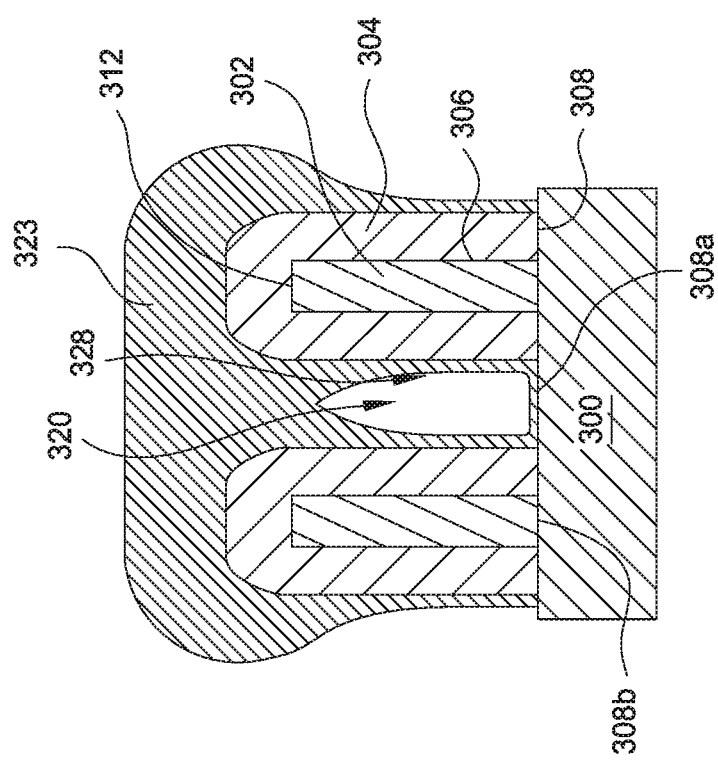

At operation 210, after the desired surface 308a of the substrate 300 is exposed, a polymer layer deposition process is then performed to form a polymer layer 323 on the substrate 300, as shown in FIG. 3E. The polymer layer 323 is similar to the protective layer 314 described above, with more uniform deposition formed across the substrate surface. As the polymer layer 323 is globally formed across the substrate 300, the polymer layer 323 is also formed on the top surface 313 of the spacer layer 304 as well as formed in the opening 320. However, as the dimension of the opening 320 is relatively small, during deposition of the polymer layer 323, an air gap 328 may be formed in the opening 320 defined between the structures 203 and the spacer layer 304, as shown in FIG. 3E. The polymer layer 323 is deposited with a sufficient thickness to cover the spacer layer 304 across the substrate 300 and the exposed surface 308a of the substrate 300.

In one example, the polymer layer 323 is formed by supplying a second deposition gas mixture into the processing chamber. The second deposition gas mixture includes at least a hydrocarbon gas and a fluorine containing gas. Suitable examples of the hydrocarbon containing gas generally have a formula $C_xH_y$, wherein x and y are integers from 1 to 20. Suitable examples of the hydrocarbon containing gas include $CH_4$, $C_2H_4$, $O_2H_6$, $C_3H_5$, $C_3H_6$, $C_4H_8$, $C_4H_{10}$ and the like. Suitable examples of the fluorine containing gas include $C_4F_6$, $CF_4$, $O_2F_4$, $C_2F_6$, $C_3F_8$, $C_3F_6$, $CHF_3$ and the like. In one specific example, the second deposition gas mixture includes $CH_4$ and $CH_3F$ and/or $CF_4$ and optionally $C_4F_6$. Inert gas, such as He or Ar, can also be added to the second deposition gas mixture as needed.

In one example, the polymer layer 323 is a hydrocarbon containing material.

During deposition, several process parameters may also be regulated. In one exemplary embodiment, a process pressure in the processing chamber 100 is regulated between about 10 mTorr and about 5000 mTorr, such as between about 10 mTorr and about 200 mTorr. A RF source and/or bias power may be utilized while forming the polymer layer 323. The RF source and the RF bias power may be applied to the processing chamber in continuous mode or in pulsed mode. In one example, the RF bias power is not applied while supplying the second deposition gas mixture. Similarly, the elimination of the RF bias power while performing the deposition process can assist the reactive species in the plasma generated from the second deposition gas mixture to be more uniformly distributed across the substrate surface without specific directionality. Thus, the polymer layer 323 is formed across the substrate surface while forming the air gap 328 in the opening 320 due to lack of the directionality of the deposition species.

In one example, the RF source power at a frequency of about 13 MHz may be applied to maintain a plasma in the deposition gas mixture. For example, a RF source power of about 20 Watts to about 2000 Watts may be applied to maintain a plasma inside the processing chamber 100. The second deposition gas mixture may be flowed into the chamber at a rate between about 5 sccm to about 800 sccm. The hydrocarbon containing gas and the fluorine containing gas from the second deposition gas mixture may be supplied simultaneously to the processing chamber or alternatively or sequentially supplied as needed. In one example, the hydrocarbon containing gas, such as $CH_4$, is first supplied in the second deposition gas mixture followed by the fluorine containing gas, such as $CH_3F$, $CF_4$ and/or $O_4F_6$.

A substrate temperature is maintained between about 10 degrees Celsius to about 300 degrees Celsius, such as between about 20 degrees Celsius and about 80 degrees Celsius, for example between about 30 degrees Celsius and about 50 degrees Celsius.

At operation 212, an etching back process is performed to remove the polymer layer 323 from the top surface 313 of the spacer layer 304, as well as the spacer layer 304 located above the top surface 312 of the structure 302, as shown in FIG. 3F. The etching back process is carefully controlled, utilizing the top surface 312 of the structure 302 as the etching stop structure so as to terminate the etching process on the interface of the top surface 312 of the structure 302 without damaging the structure 302 or the spacer layer 304 lining one sidewalls 306 of the structure as well as the surface 308a of the substrate 300.

In one example, the etching back process is performed by supplying a second etching gas mixture. The second gas mixture includes an inert gas and/or a fluorine containing gas and optionally an oxygen containing gas. In one embodiment, the second etching gas mixture include an inert gas, such as He or Ar, and/or a fluorine containing layer and/or an oxygen containing gas. Suitable examples of the fluorine containing gas include $NF_3$, HF, $CF_4$, $CHF_3$, and the like. Suitable examples of the oxygen containing gas include $O_2$, $NO_2$, $N_2O$, $O_3$, $H_2O$ and the like. In one specific example, the second etching gas mixture include Ar, $CHF_3$ and $O_2$.

During the etching process, several process parameters may also be regulated. In one exemplary embodiment, a process pressure in the processing chamber 100 is regulated between about 10 mTorr and about 5000 mTorr, such as between about 10 mTorr and about 200 mTorr. A RF source and/or bias power may be utilized while performing the flash etching process. The RF source and the RF bias power may be applied to the processing chamber in continuous mode or in pulsed mode. In one example, the RF bias power is not applied while supplying the second etching gas mixture so that the etching species may distribute across the substrate and gradually etch the polymer layer 323 and the spacer layer 304 located above the top surface 312 of the structure 302 at a steady and predicable rate.

In one example, the RF source power at a frequency of about 13 MHz may be applied to maintain a plasma in the deposition gas mixture. For example, a RF source power of about 20 Watts to about 1000 Watts may be applied to maintain a plasma inside the processing chamber 100. A RF bias power is not applied while supplying the second etching gas mixture.

The second etching gas mixture may be flowed into the chamber at a rate between about 5 sccm to about 900 sccm. The second etching gas mixture, such as the inert gas and/or the fluorine containing gas and/or the oxygen containing gas may be supplied simultaneously to the processing chamber or alternatively or sequentially supplied as needed. In one example, the oxygen containing gas is supplied followed by the inert gas and/or the fluorine containing gas. Alternatively, the second gas mixture include inert gas, the fluorine containing gas, the oxygen containing gas simultaneously supplied at the same time as needed.

A substrate temperature is maintained between about 10 degrees Celsius to about 300 degrees Celsius, such as between about 20 degrees Celsius and about 80 degrees Celsius, for example between about 30 degrees Celsius and about 50 degrees Celsius.

Figures 3G, 3H:
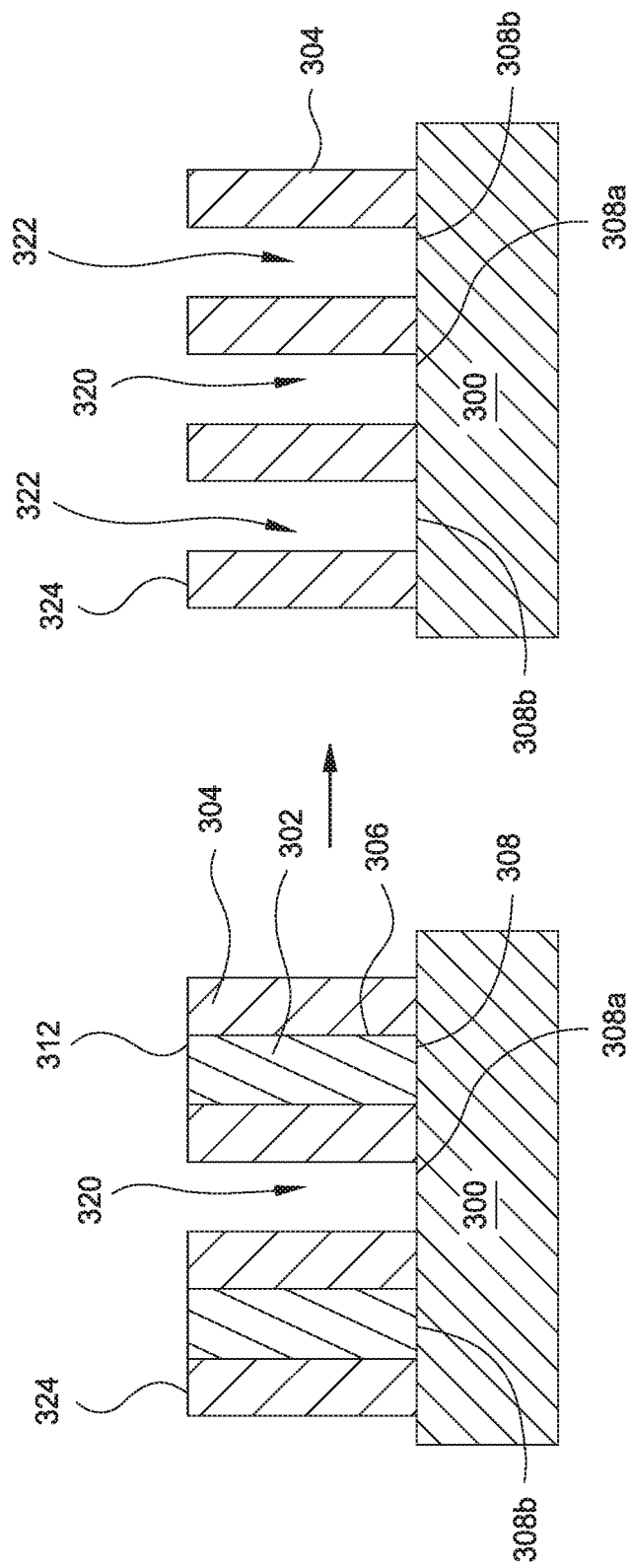

At operation 214, after the polymer layer 323 is etched, an oxygen flash process is then performed to remove the residual polymer layer 323 from the substrate 300, as shown in FIG. 3G. The oxygen flash process provides oxygen species to react with the residual polymer layer 323 from the substrate 300. In one example, the oxygen flash process is performed by supplying an oxygen gas into the processing chamber. The oxygen gas may be supplied at a predetermined time period until the residual polymer layer 323 is removed from the substrate 300.

After operation 216, a structure etching process is performed to predominately remove the structure 302 from the substrate 300 without substantially damaging the spacer layer 304, as shown in FIG. 3H. As the structure 302 is removed, the spacer layer 304 remained on the substrate 300 defined openings 322 therebetween with a desired dimension. By the multiple deposition and etching process as described above, the spacer layer 304 and the structure 302 may be etched, shaped, and removed in a desired order to produce a desired profile by the protection of the protective layer 314 and the polymer layer 323.

The structure etching process may be performed by supplying a third etching gas mixture into the processing chamber to selectively etch the structure 302 without substantially etching or damaging the spacer layer 304. The third etching gas mixture include a nitrogen containing gas and an oxygen containing gas. As the structure 302 depicted herein may be fabricated by a carbon containing material, such as amorphous carbon, an oxygen containing gas is then utilized to ash or strip away the structure 302 from the substrate 300. In one example, the third etching gas mixture include $O_2$ gas and $N_2$ gas. The process parameters are similarly controlled as the first and the second etching gas mixture supplied above. In one example, a RF bias power is not supplied while supplying the third etching gas mixture to etch the structure 302, but the RF source power.

Thus, methods for patterning features and manufacturing nanostructures with desired small dimensions in a film stack are provided. The methods utilize a polymer layer deposition process and protective layer deposition process to form a polymer layer and protective layer to protect certain regions of the structures on the substrate while patterning a material layer in the structure as needed. By doing so, different regions of the material layer maybe patterned or etched at different rates or different orders so that the structure on the substrate may be pertained at a desired profile after the patterning process.

While the foregoing is directed to embodiments of the present disclosure, other and further embodiments of the disclosure may be devised without departing from the basic scope thereof, and the scope thereof is determined by the claims that follow.

We claim:

1. A method for patterning a spacer layer on a substrate, comprising:
    forming a protective layer on a spacer layer disposed on a structure disposed on a substrate, wherein the protective layer is formed predominately on a top surface of the spacer layer, than a bottom surface of the spacer layer;
    etching the spacer layer from the bottom surface;
    forming a polymer layer on the substrate;
    etching a top portion of the polymer layer and a first portion the spacer layer located the top surface of the structure; and
    removing the structure from the substrate and leaving a second portion the spacer layer on the substrate.

2. The method of claim 1, further comprising:
    repeatedly forming the protective layer on the spacer layer and etching the spacer layer until a surface of the substrate is exposed.

3. The method of claim 1, wherein the protective layer has a first thickness formed on the top surface of the spacer layer and a second thickness formed on the bottom surface of the spacer layer, wherein the first thickness is greater than the second thickness.

4. The method of claim 3, wherein the spacer layer is etched to have a third thickness on the bottom surface of the spacer layer, wherein the third thickness is about 5 percent to 70 percent thinner than the second thickness after each etching of the spacer layer.

5. The method of claim 2, wherein the forming of the protective layer and the etching of the spacer layer is repeatedly performed for between about 20 times and about 40 times.

6. The method of claim 1, wherein the protective layer is a hydrocarbon containing material.

7. The method of claim 1, wherein forming the protective layer further comprises:
    supplying a first deposition gas comprising a hydrocarbon containing gas.

8. The method of claim 7, wherein the hydrocarbon containing gas is selected from a group consisting $CH_4$, $C_2H_4$, $C_2H_6$, $C_3H_8$, $C_3H_6$, $C_4H_8$ and $C_4H_{10}$.

9. The method of claim 1, wherein etching the spacer layer further comprises:
    supplying a first etching gas mixture followed by an oxygen containing gas mixture.

10. The method of claim 8, wherein the first etching gas mixture comprises a halogen containing gas, wherein the halogen containing gas is selected from a group consisting $C_4F_6$, $CF_4$, $C_2F_4$, $C_3F_5$, $C_3F_6$, $CHF_3$, $SiCl_4$ and $C_2F_6$.

11. The method of claim 1, wherein the spacer layer is a silicon containing layer.

12. The method of claim 1, wherein the structure is a carbon containing layer.

13. The method of claim 1, wherein the polymer layer is a hydrocarbon containing layer.

14. The method of claim 1, wherein etching the spacer layer further comprises:
    supplying a second etching gas mixture, wherein the second gas mixture comprises $NF^3$.

15. The method of claim 1, wherein etching the portion of the polymer layer and the spacer layer further comprises:
    supplying a third etching gas mixture, wherein the second gas mixture comprises a hydrocarbon containing gas and a fluorine containing layer.

16. A method for patterning a spacer layer on a substrate, comprising:
    repeatedly forming a protective layer and etching a bottom portion of a spacer layer formed on a structure on a substrate until the bottom portion of the spacer layer is etched away and a surface of the substrate is exposed, wherein the spacer layer is conformally formed on the structure having a top portion, sidewall portions, and the bottom portion;
    forming a polymer layer predominately on the top portion of the spacer layer;
    etching the polymer layer and the top portion of the spacer layer and leaving the sidewall portions of the spacer layer lining on the structure; and
    removing the structure from the substrate.

17. The method of claim 16, further comprising:
    forming openings between the sidewall portions of the spacer layer.

18. The method of claim 16, wherein the spacer layer and the structure are fabricated from different materials.

19. The method of claim 16, wherein the protective layer and the polymer layer are hydrocarbon material.

20. A method for patterning a spacer layer on a substrate, comprising:
    selectively etching a bottom portion of a spacer layer disposed on a substrate while having a protective layer formed on a top portion of the spacer layer;
    etching the bottom portion of the spacer layer until the substrate disposed thereunder is exposed;
    forming a polymer layer on the top portion of the spacer layer; and
    etching the polymer layer and the spacer layer to form openings in the spacer layer.

* * * * *

UNITED STATES PATENT AND TRADEMARK OFFICE
CERTIFICATE OF CORRECTION

PATENT NO. : 10,727,058 B2  
APPLICATION NO. : 16/521306  
DATED : July 28, 2020  
INVENTOR(S) : Vinay Shankar Vidyarthi et al.

Page 1 of 1

It is certified that error appears in the above-identified patent and that said Letters Patent is hereby corrected as shown below:

In the Specification

In Column 4, Line 40, delete "$C_4F_5$," and insert -- $C_4F_8$, --, therefor.

In Column 10, Line 46, delete "$O_2H_6$, $C_3H_5$," and insert -- $C_2H_6$, $C_3H_8$, --, therefor.

In Column 10, Line 48, delete "$O_2F_4$," and insert -- $C_2F_4$, --, therefor.

In Column 11, Line 19, delete "$O_4F_6$." and insert -- $C_4H_6$. --, therefor.

In Column 11, Line 45, delete "03," and insert -- $O_3$, --, therefor.

In the Claims

In Column 14, Line 2, in Claim 10, delete "$C_3F_5$," and insert -- $C_3F_8$, --, therefor.

Signed and Sealed this  
Twenty-second Day of September, 2020

Andrei Iancu  
*Director of the United States Patent and Trademark Office*